United States Patent
Yoon et al.

(10) Patent No.: US 6,890,820 B2
(45) Date of Patent: May 10, 2005

(54) METHOD OF FABRICATING FLASH MEMORY DEVICES

(75) Inventors: Jung-Lim Yoon, Seoul (KR); Jae-Min Yu, Seoul (KR); Chang-Rok Moon, Ahnyang-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/645,049

(22) Filed: Aug. 21, 2003

(65) Prior Publication Data

US 2004/0058495 A1 Mar. 25, 2004

(30) Foreign Application Priority Data

Sep. 19, 2002 (KR) .................................. 10-2002-0057191

(51) Int. Cl.[7] .............................................. H10L 21/336
(52) U.S. Cl. ...................... 438/257; 438/258; 438/259; 257/314; 257/315; 257/316
(58) Field of Search ................................. 437/257–259, 437/197, 260–264; 438/314–316

(56) References Cited

U.S. PATENT DOCUMENTS

| | | | |
|---|---|---|---|
| 6,403,494 B1 | 6/2002 | Chu et al. ................... | 438/719 |
| 6,451,654 B1 | 9/2002 | Lin et al. .................... | 438/266 |
| 2002/0055205 A1 * | 5/2002 | Lin et al. .................... | 438/142 |
| 2002/0072197 A1 * | 6/2002 | Kang et al. ................. | 438/424 |

* cited by examiner

Primary Examiner—Dung A. Le
(74) Attorney, Agent, or Firm—F. Chau & Associates LLC

(57) ABSTRACT

A method of fabricating split gate type FLASH memory device comprises forming trench device isolation layers in a substrate to define a plurality of parallel first active regions. A gate insulation pattern, a conductive pattern and a hard mask pattern, which are sequentially stacked, are formed to have sidewalls aligned to sidewalls of the trench device isolation layer. Along each of the first active regions, the hard mask pattern is removed at regular intervals to expose a top of the conductive pattern. An oxide pattern is formed on the exposed top of the conductive pattern and the hard mask pattern is removed. Using the oxide pattern as an etch mask, the conductive pattern is etched to form floating gate patterns arranged over each of the first active regions at regular intervals. Tunnel oxide layers are formed on sidewalls of the floating gate patterns. A plurality of control gate electrodes are formed to cross over the first active regions. The control gate electrodes are disposed on the floating gate patterns.

12 Claims, 17 Drawing Sheets

METHOD OF FABRICATING FLASH MEMORY DEVICES

BACKGROUND OF THE INVENTION

1. Field of the Invention

The present invention relates to a method of fabricating a FLASH memory device, and more particularly to a method of fabricating a FLASH memory device including a split gate.

2. Discussion of Related Art

FLASH memory devices can electrically write or erase data. FLASH memory devices maintain data without a power supply. Therefore, the FLASH memory devices have been widely used in various technologies. FLASH memory devices can be classified into NAND type and NOR type devices according to a structure of a memory cell array. Comparatively, NAND type FLASH memory devices can be highly integrated within a unit area of a circuit and NOR type FLASH memory devices have a fast response speed.

In NOR type FLASH memory devices, memory cells are arranged along rows and columns, a plurality of bit lines are disposed parallel to the rows and a plurality of word lines are disposed with parallel to columns. The memory cells in each of the rows are connected to a bit line in parallel and the memory cells in each of the columns are connected to a word line in parallel.

A memory cell of a NOR type FLASH memory device is selected by selecting a word line and a bit line. Accordingly, the memory cells of NOR type FLASH memory devices can be accessed randomly, so that the response speed thereof is faster than that of the NAND type FLASH memory device. In the NOR type FLASH memory device, a plurality of memory cells are connected to a bit line in parallel, so that if a memory cell transistor connected to the bit line is erased, current passes through the bit line regardless of a state of a selected memory cell. Therefore, each memory cell that is connected to the bit line is read as if the memory cells are in a turned-on state.

A split gate type FLASH memory device is another type of FLASH memory device. Word lines of the split gate type FLASH memory device act as a selection gate and a control gate, overlap a portion of a floating gate.

FIG. 1A is a top plane view of a conventional split gate type FLASH memory device.

Referring to FIG. 1A, device isolation layers 8 are disposed to defined first and second active regions 12a and 12b, which intersect each other. A pair of floating gate patterns 14 are disposed on each first active region 12a between adjacent second active regions 12b. Word lines 18 crossing over the first active regions 12a are disposed on the floating gate patterns 14. The word lines 18 lie on top of the floating gate patterns 14 and on the first active regions 12a beside a sidewall of the floating gate patterns 14. Drain regions are formed in the first active regions 12a between adjacent word lines 18 and a bit line plug 20 is connected to each drain region.

Referring to FIG. 1B, after active regions 12a and 12b are defined in a substrate, a conductive layer is formed. The conductive layer is patterned to form a floating gate 14 of the conventional split gate type nonvolatile memory device. Edges of a pattern formed by a photolithographic process are rounded due to a proximity effect even though the pattern is designed to be rectangular in layout. As illustrated in the FIG. 1B, a width of the elliptical floating gate pattern may reduced at the edges, so that when the floating gate pattern is misaligned, a channel under the floating gate decreases in width and influences characteristics of the memory cell. Thus, variations in cell characteristics in a cell array may be widened. Referring to FIG. 1C, if a width of the active region becomes narrow due to a high integration of the semiconductor device, a misalignment of the floating gate causes a direct contact of a word line 18 and a substrate 10 between a device isolation layer 8 and the floating gate pattern 14. In addition, the floating gates of the adjoining memory cells connected to adjoining bit lines needs to be separated from each other on the device isolation layer by a predetermined distance, so that the distance between the adjoining floating gates should be defined wider than a minimum line width. Therefore, the width of the device isolation pattern 8 may not be reduced to a minimum line width.

SUMMARY OF THE INVENTION

According to an embodiment of the present invention, a split gate type FLASH memory device is formed comprising floating gate patterns thereof without harmful influence of a misalignment or a proximity effect during a photolithographic process.

According to an embodiment of the present invention, a method of forming a split gate type FLASH memory device minimizes variations in cell characteristics in a cell array.

According to an embodiment of the present invention, there are provided methods of fabricating a split gate type FLASH memory device including floating gates with sidewalls aligned to sidewalls of a trench device isolation layer. The methods comprise forming trench device isolation layers to define a plurality of parallel first active regions. A gate insulation pattern, a conductive pattern and a hard mask pattern, which are sequentially stacked and include sidewalls aligned to sidewalls of the trench device isolation layer, are formed on the first active region. The hard mask pattern is removed at regular intervals along each first active region so as to expose a top of the conductive pattern. An oxide pattern is formed on the exposed conductive pattern and the hard mask pattern is removed. Using the oxide pattern as an etch mask, the conductive pattern is etched to form floating gate patterns disposed on each first active region at regular intervals. Tunnel oxide layers are formed on sidewalls of the floating gate pattern and a plurality of control gate electrodes are formed, crossing over the first active regions. The control gate electrodes are disposed on the floating gate patterns.

BRIEF DESCRIPTION OF THE DRAWINGS

Preferred embodiments of the present invention will be described below in more detail, with reference to the accompanying drawings:

FIGS. 3A–9A are top plane views showing methods of fabricating a split gate type FLASH memory device according to an embodiment of the present invention FIGS. 3B–9B are cross-sectional views taken along a line B—B of FIGS. 3A–9A.

FIGS. 3C–9C are cross-sectional views taken along a line C—C of FIGS. 3A–9A.

DETAILED DESCRIPTION OF PREFERRED EMBODIMENTS

Figure 1A:
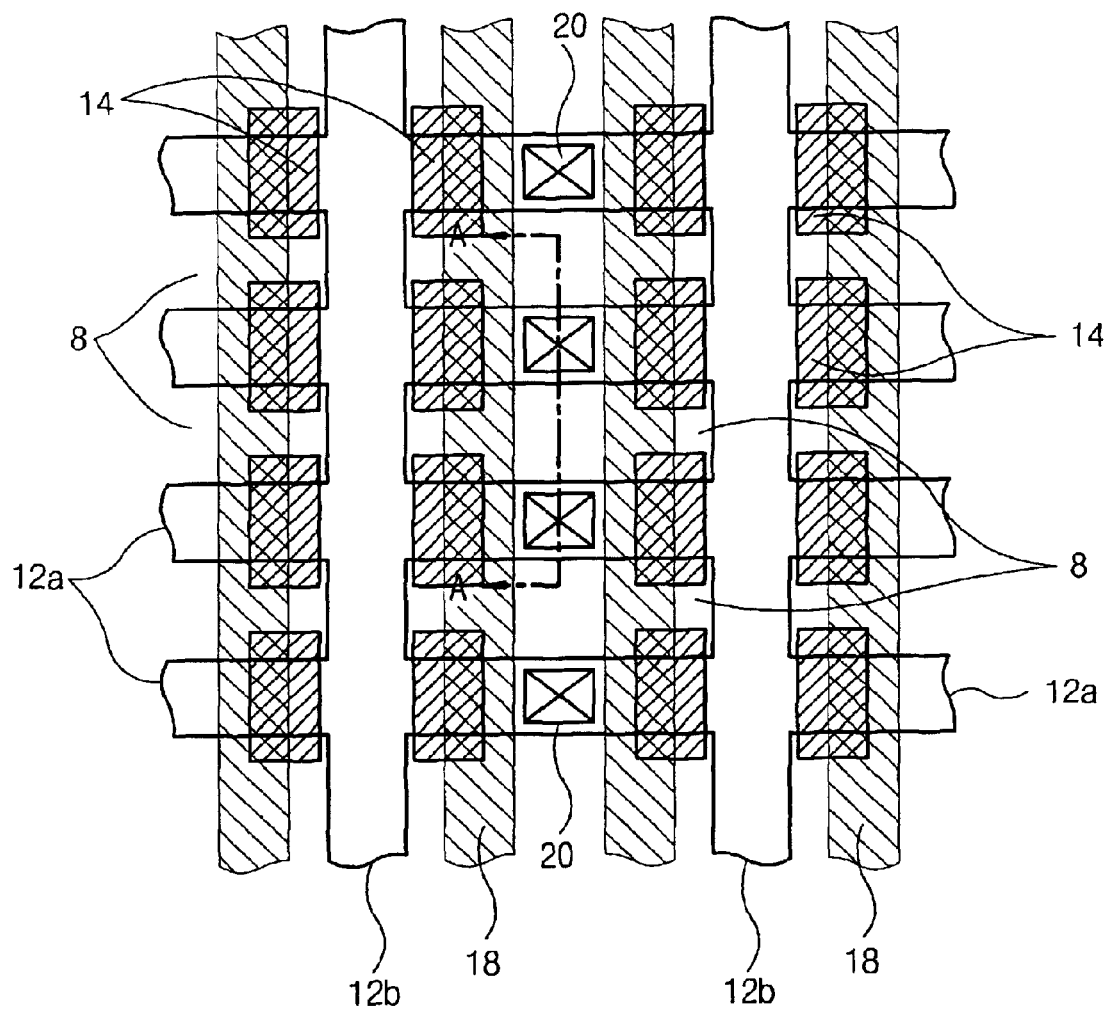
FIG. 1A is a top plane view of a conventional split gate type FLASH memory device.
Figure 1B:
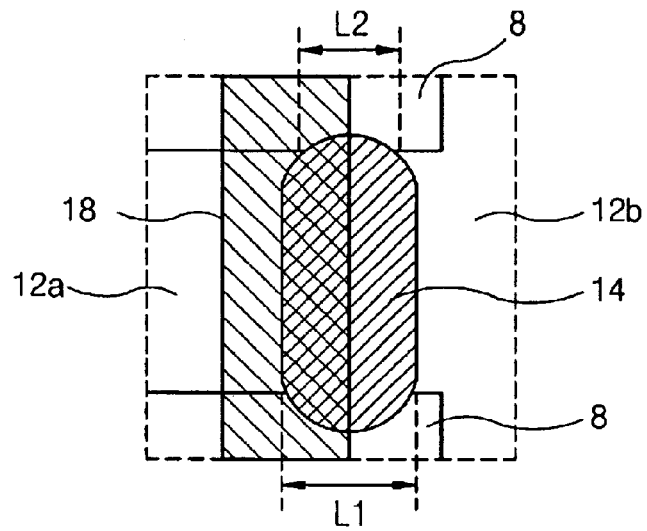
FIG. 1B shows a conventional split gate type FLASH memory device.
Figure 1C:
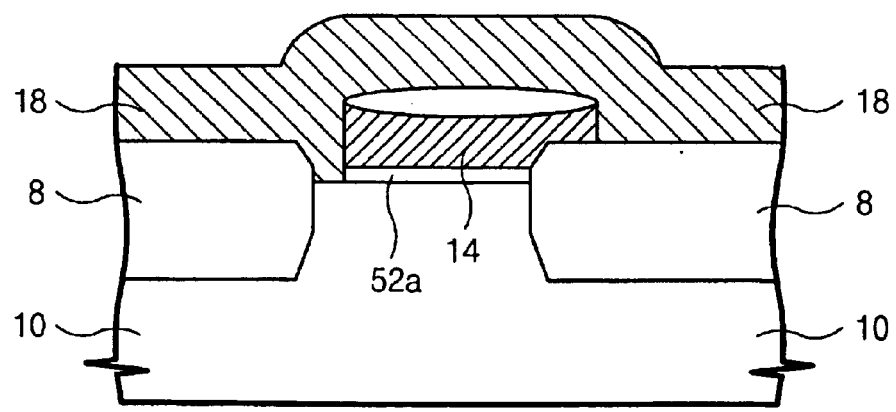
FIG. 1C is a cross-sectional view taken along a line A—A of FIG. 1A.

The present invention will be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
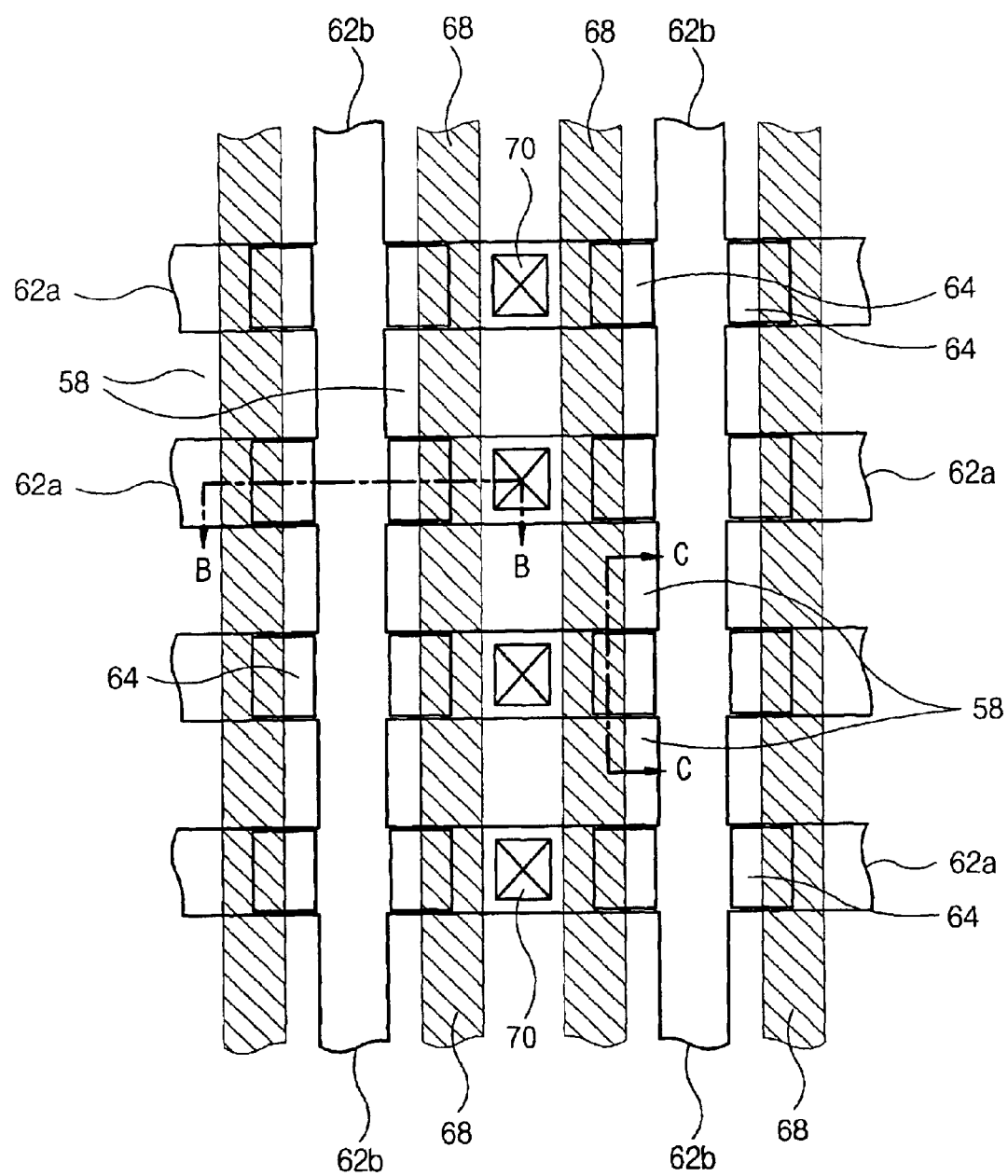
FIG. 2 is a top plane view of a split gate type FLASH memory device according to an embodiment of the present invention.

FIG. 2 is a plane view of a NOR type split gate FLASH memory device in accordance with an exemplary embodiment of the present invention.

Referring to FIG. 2, a spilt gate type FLASH memory device includes device isolation layers 58 disposed in a substrate to define a plurality of first active regions 62a that are parallel to each other. Floating gate patterns 64 are disposed on the first active regions 62a at regular intervals. A plurality of parallel word lines 68 crossing over the first active regions 62a are disposed on the floating gate patterns 64. The word lines 68 lie on a plurality of floating gate patterns 64 and the first active regions 62a beside a sidewall of each of the plurality of floating gate patterns 64.

The device isolation layer 58 defines a plurality of second active regions 62b that are parallel to each other and cross the first active regions 62a. is A pair of floating gate patterns 64 are disposed on each of the first active regions 62a between intersections of the first and second active regions 62a and 62b. Drain regions are formed in each first active region 62a between the word lines 68 lying on the first active regions 62a. Source regions are formed in each second active region 62b between the word lines lying on the first active regions 62a. A bit line plug 70 is disposed on each drain region. Therefore, the source region comprises a shared source region where memory cells at both sides of the source region are connected in parallel. A shared source pattern connected to the first active regions 62a may be disposed in the position of the second active regions 62b, replacing the second active regions 62b. In exemplary embodiment of the present invention, the device isolation layer 58 is formed with a trench structure and the floating gate pattern 64 includes sidewalls aligned to sidewalls of the device isolation layer 58.

FIGS. 3A–9A are top plane views illustrating a method of fabricating a split gate type FLASH memory device in accordance with the exemplary embodiment of the present invention.

FIGS. 3B–9B are cross-sectional views taken along a line B—B of FIGS. 3A–9A, respectively.

FIGS. 3C–9C are cross-sectional views taken along a line C—C of FIGS. 3A–9A.

Figure 3A:
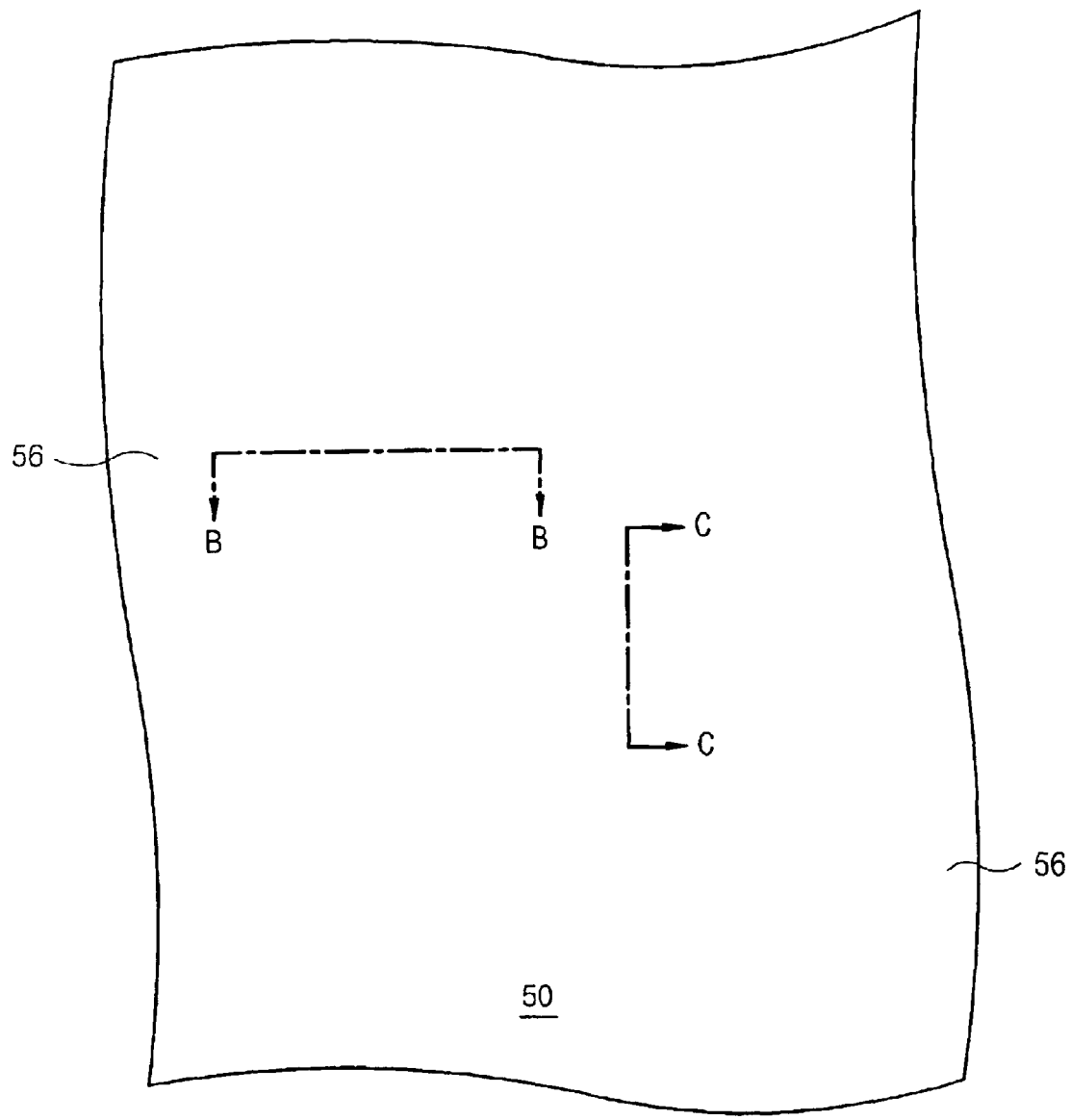
Figure 3B:
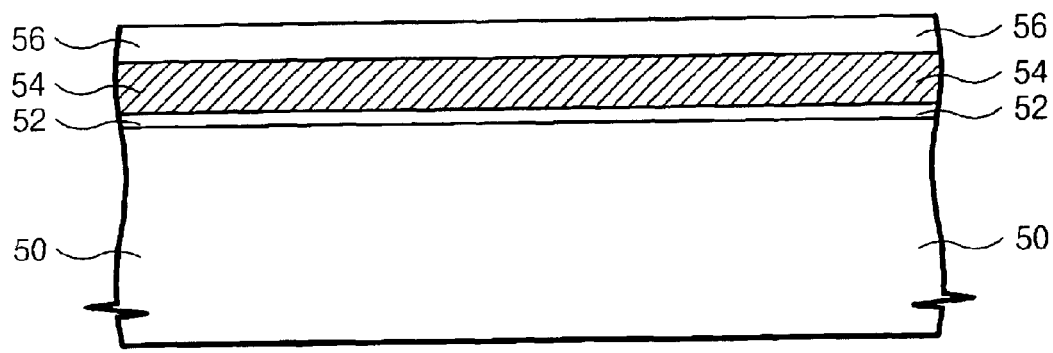
Figure 3C:
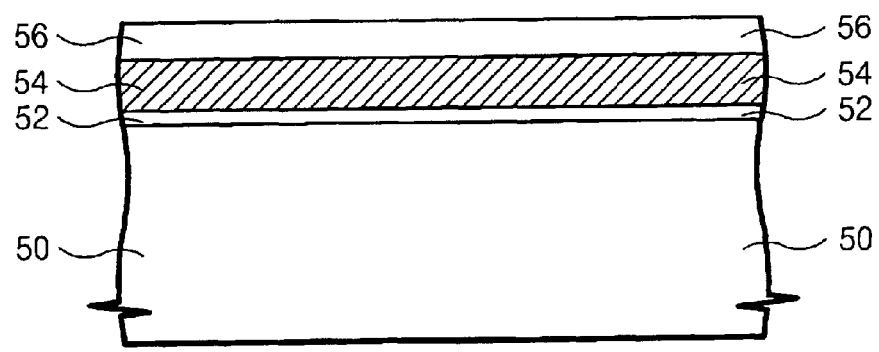

Referring to FIGS. 3A, 3B and 3C, a gate insulation layer 52, a conductive layer 54 and a hard mask layer 56 are stacked on a substrate 50. The gate insulation layer 52 may be formed of silicon oxide, silicon oxynitride or the like, the conductive layer 54 may be formed of polysilicon and the hard mask layer 56 may be formed of silicon nitride.

Figure 4A:
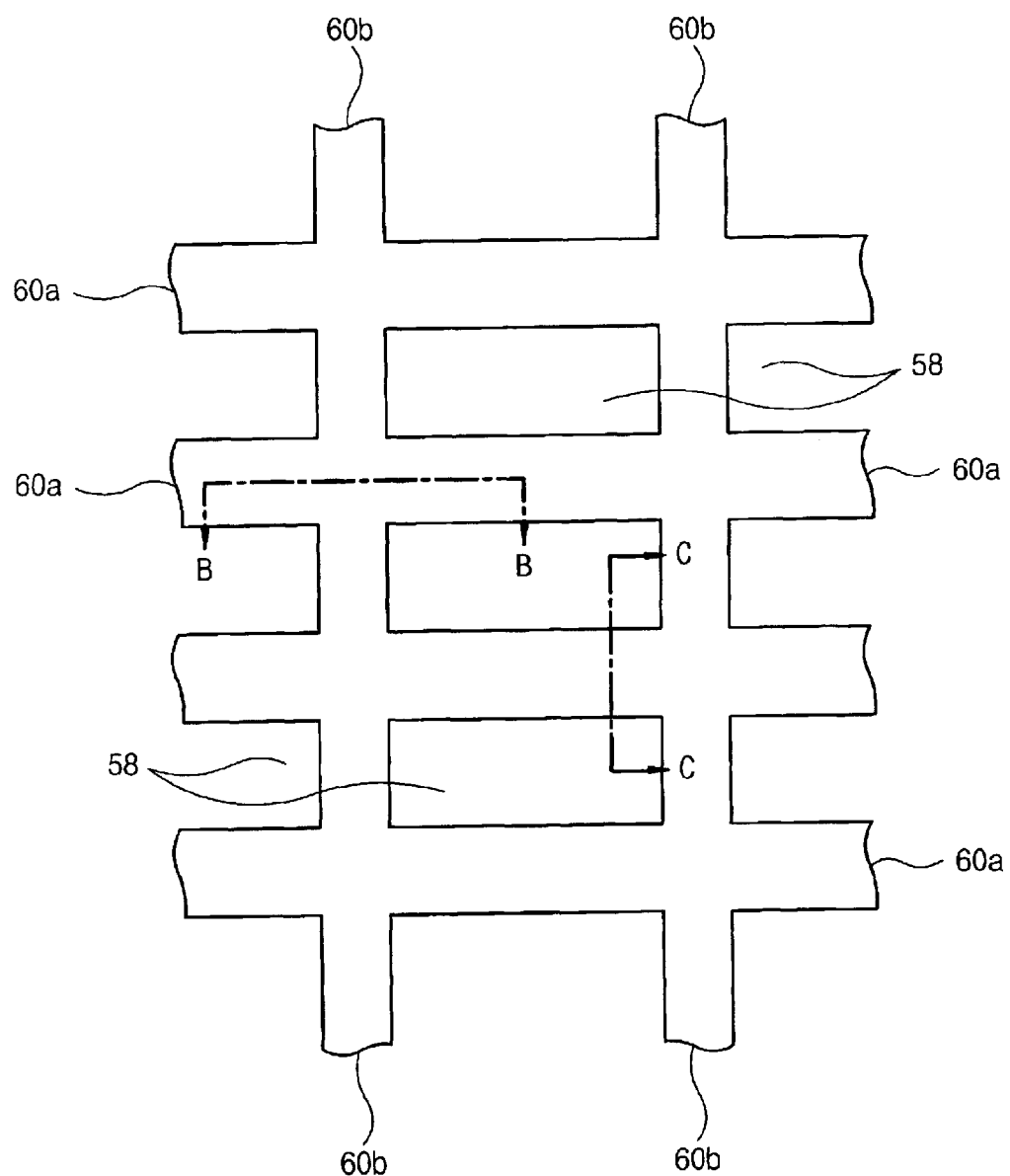
Figure 4B:
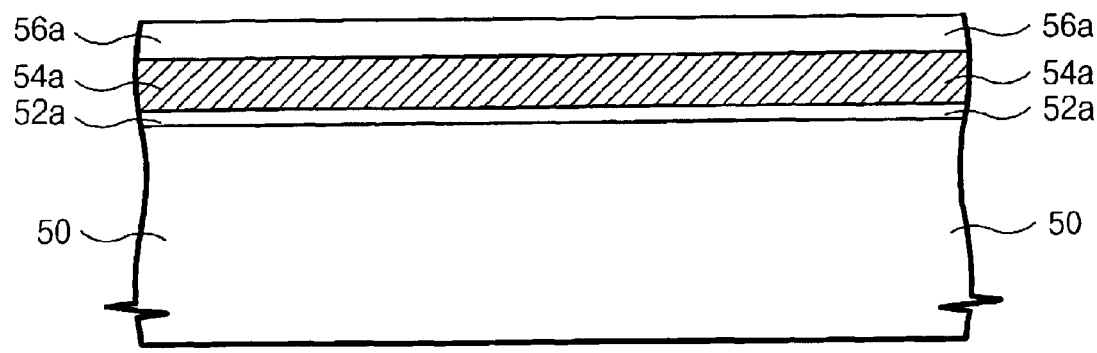
Figure 4C:
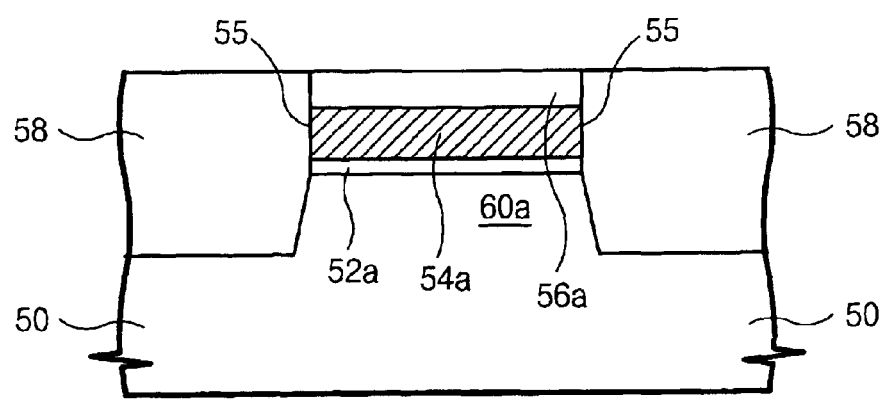

Referring to FIGS. 4A, 4B and 4C, the hard mask layer 56, the conductive layer 54 and the gate insulation layer 52 are patterned to form a plurality of parallel patterns comprising a gate insulation pattern 52a, a conductive pattern 54a and a hard mask pattern 56a, which are sequentially stacked on the substrate 50. Using the hard mask pattern 56a as an etch mask, the substrate 50 is etched to form a trench so as to define a plurality of parallel first active regions 60a. An insulation layer is filled within regions between the stacked patterns and the trench, thereby forming a trench isolation layer 58. The patterns comprising the gate insulation pattern 52a, the conductive pattern 54a and the hard mask pattern 56a, which are sequentially stacked, are arranged on the first active regions 60a. The conductive pattern 54a includes sidewalls 55 aligned to the sidewalls of the trench isolation layer 58. A portion of top of the trench device isolation layer 58 is recessed to reduce step differences between a substrate where a peripheral circuit and a logic circuit will be formed and device isolation layers. However, the recess needs to be controlled with respect to depth so that a top of the trench isolation layer 58 is higher than a top of the conductive pattern 54a. If the top of the trench isolation layer 58 is lower than that of the conductive pattern 54a, sidewalls of conductive pattern 54a are oxidized by a thermal oxidation process for forming an oxide pattern on a floating gate pattern. If the sidewalls of conductive pattern 54a are oxidized, it is difficult to form a tip of the floating gate pattern for Fowler-Nordheim tunneling.

As illustrated above, the gate insulation pattern 52a, the conductive pattern 54a and the hard mask pattern 56a, which are stacked on the substrate, may be formed with a mesh. Using the hard mask pattern 56a as an etch mask, the substrate 50 may be etched to form an active region with a mesh. The mesh shaped active region comprises a plurality of parallel first active regions 60a and a plurality of second active regions 60b, which cross the first active regions 60a. Shared source regions of the NOR type FLASH memory device are formed in the second active regions 60b.

Figure 5A:
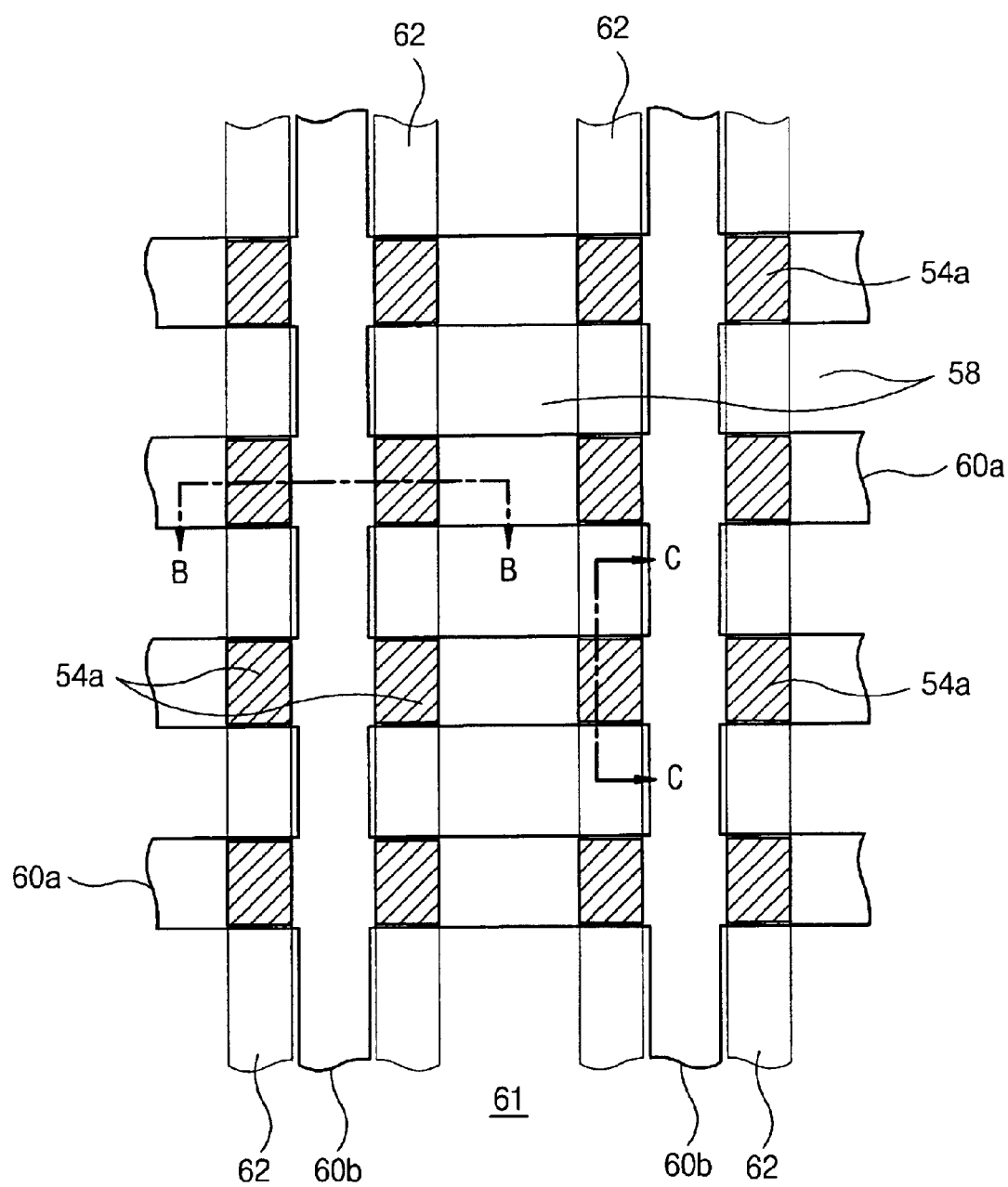
Figure 5B:
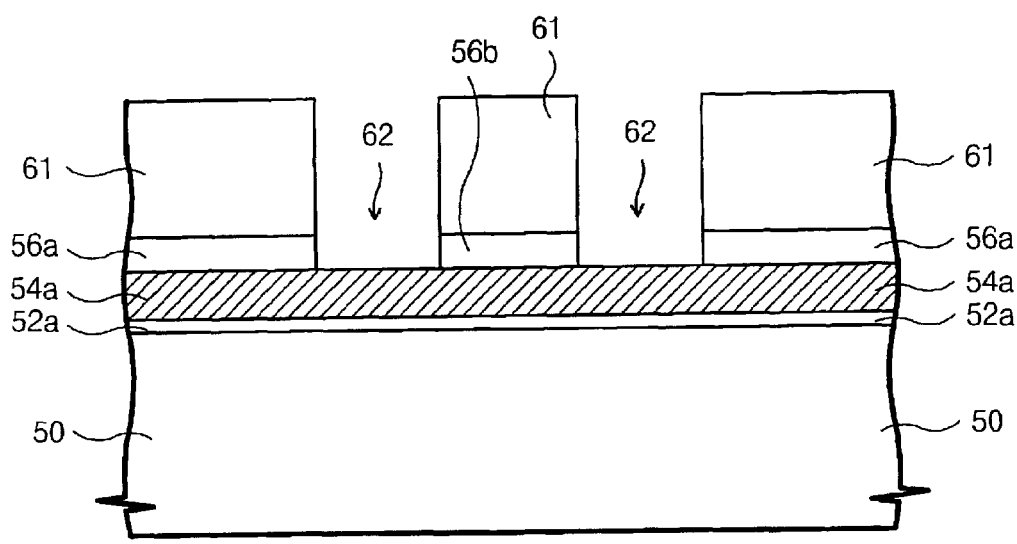
Figure 5C:
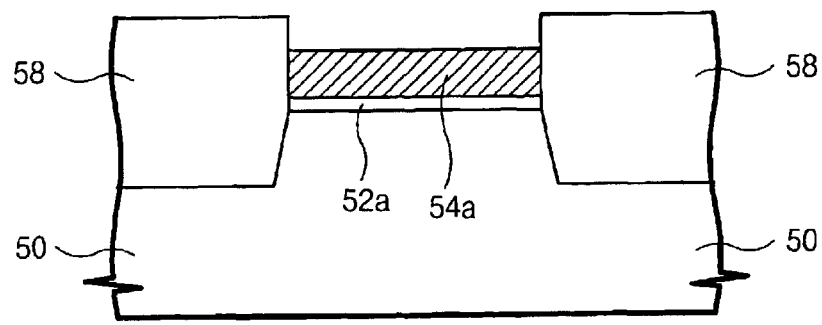

Referring to FIGS. 5A, 5B and 5C, a photoresist pattern 61 is formed over the substrate 50. The photoresist pattern 61 includes a plurality of openings 62 parallel to the second active regions 60b. The hard mask pattern 56a and the device isolation pattern 58 are alternately exposed in the openings 62. A pair of openings 62 are disposed between the second active regions 60b. Using the photoresist pattern 61 as an etch mask, the hard mask pattern 56a is etched. Therefore, a top of the conductive pattern 54a is exposed in each of the openings 62 at regular intervals. Two parts of the top of the conductive pattern 54a are exposed on each of the first active region 60a between the second active regions 60b.

Figure 6A:
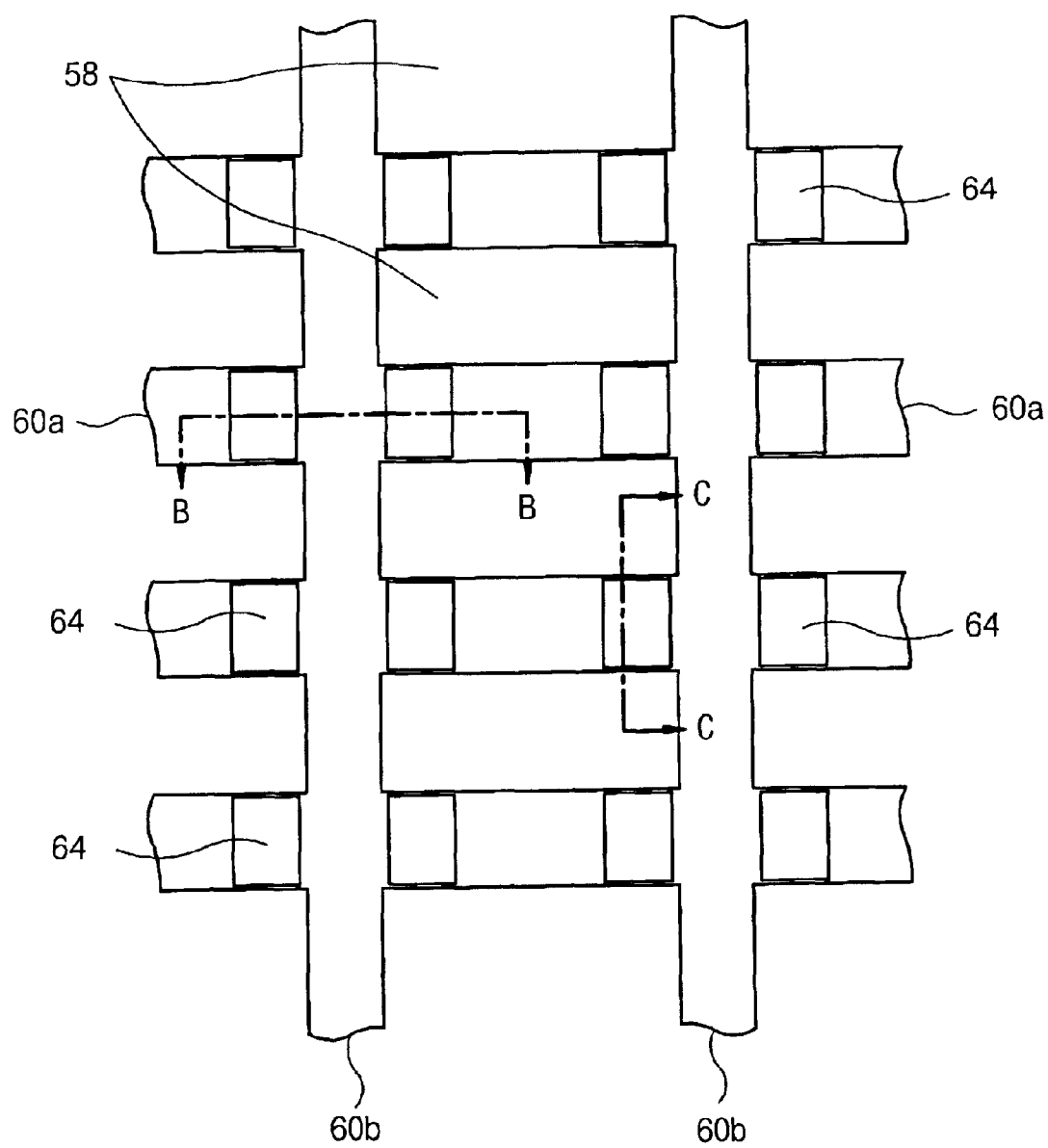
Figure 6B:
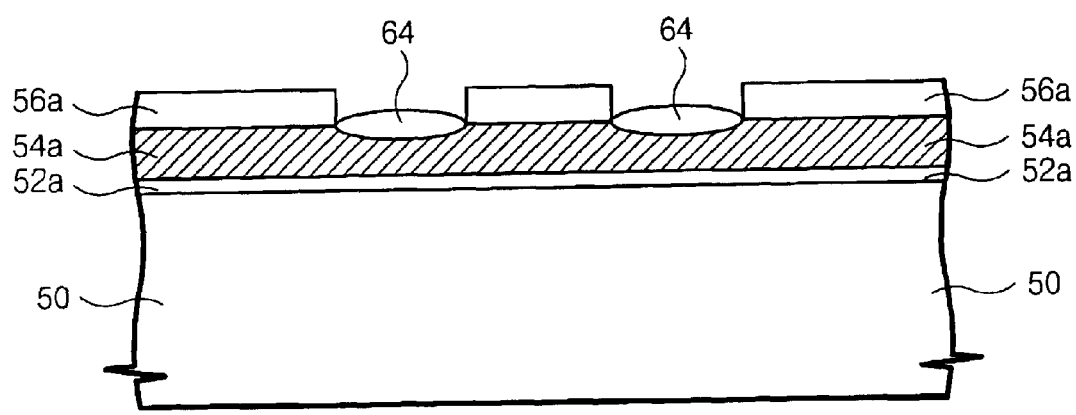
Figure 6C:
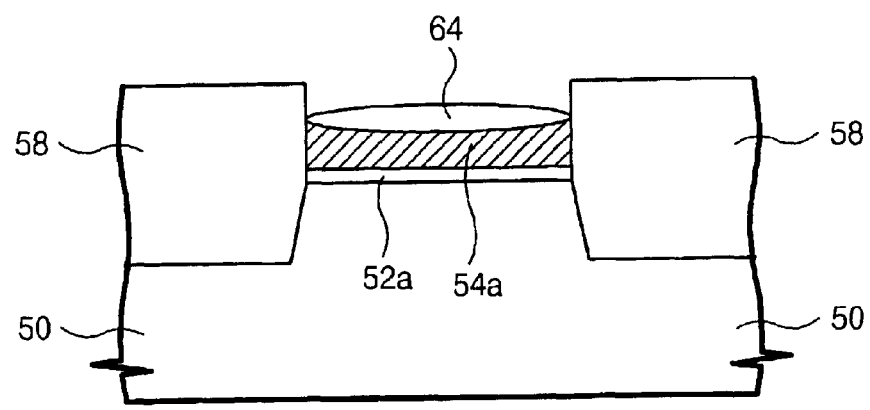

Referring to FIGS. 6A, 6B and 6C, the photoresist pattern 61 is removed. As a result, the top of the conductive pattern 54a, which is defined by the device isolation layers 58 and the hard mask patterns 56a, is exposed over the substrate 50 like islands arranged along rows and columns. An oxide pattern 64 is formed on the exposed conductive pattern 54a. The oxide pattern 64 may be formed by performing an oxidation, oxidizing the exposed conductive pattern 54a. The oxide pattern 64 is formed having an elliptical cross-section due to a three dimensional-effect.

Figure 7A:
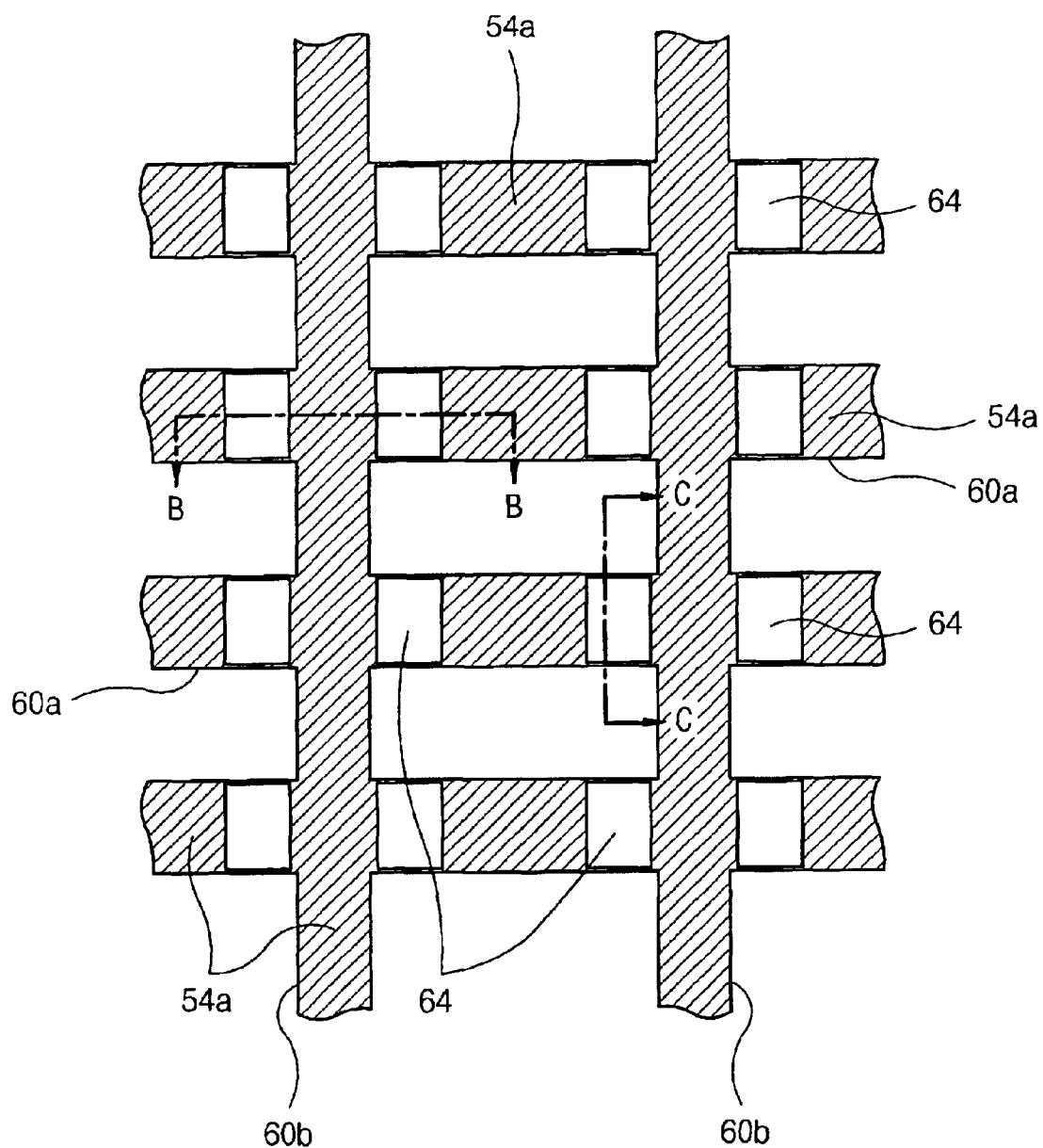
Figure 7B:
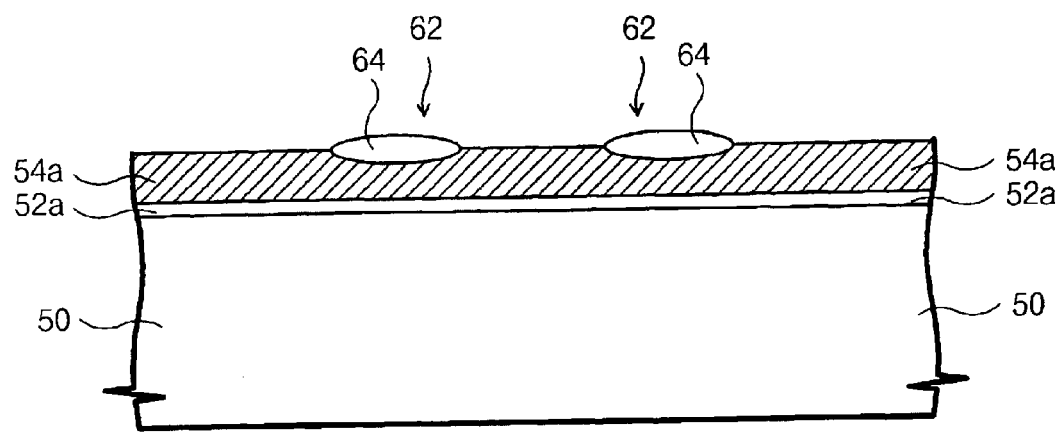
Figure 7C:
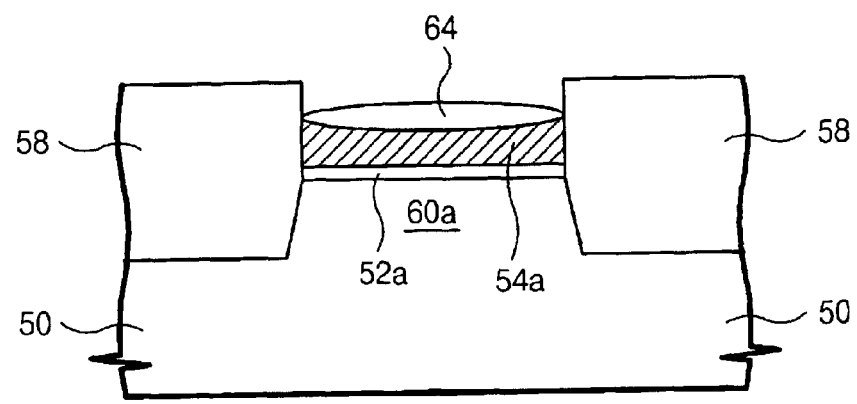

Referring to FIGS. 7A, 7B and 7C, the hard mask pattern 56a is removed. As a result, the conductive pattern 54a is exposed over the first active region 60a and the second active region 60b. The oxide patterns 64 are disposed on the conductive patterns 54a at regular intervals.

Figure 8A:
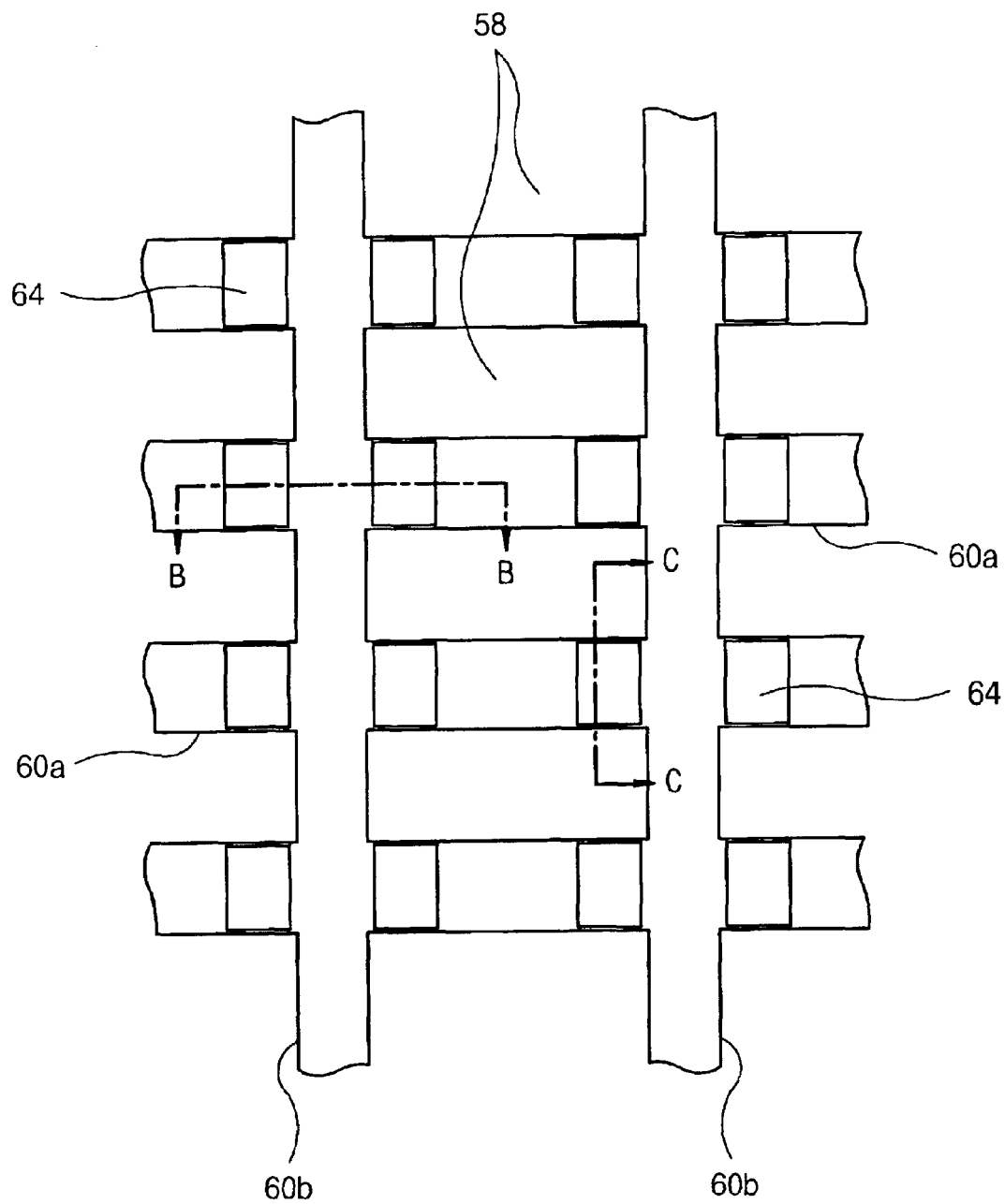
Figure 8B:
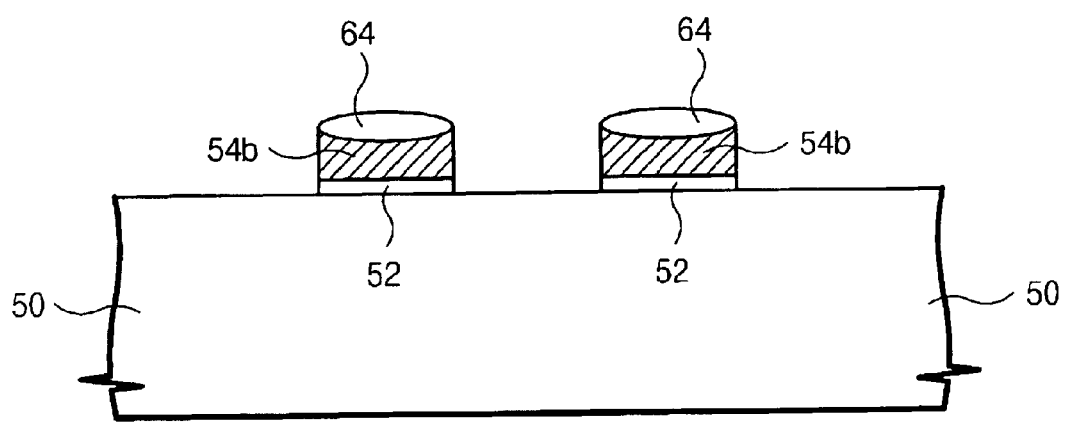
Figure 8C:
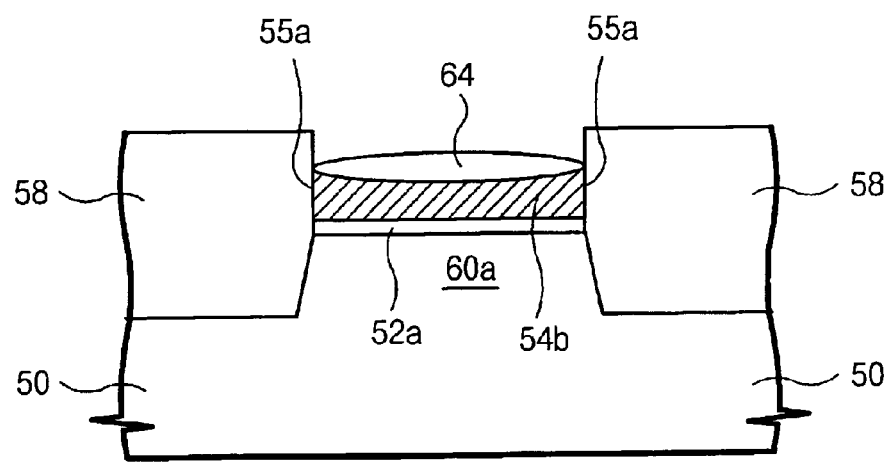

Referring to FIGS. 8A, 8B and 8C, using the oxide patterns 64 as an etch mask, the conductive pattern 54a is etched. Thus, floating gate patterns 54b are formed on the first active region 60a at regular intervals. The floating gate pattern 54b includes sidewalls 55a aligned to sidewalls of the trench device isolation layer 58. The oxide pattern 64 is disposed on the top of the floating gate pattern 54b. The oxide pattern 64 has an elliptical cross-section, so that tips may be formed at top edges of the floating gate pattern 54b. In the mesh shaped active region comprising the first and second active regions 60a and 60b, intersections of the first and second active regions 60a and 60b are disposed on a substrate and a pair of floating gate pattern 54b may be disposed on the first active region 60a between the intersections.

Figure 9A:
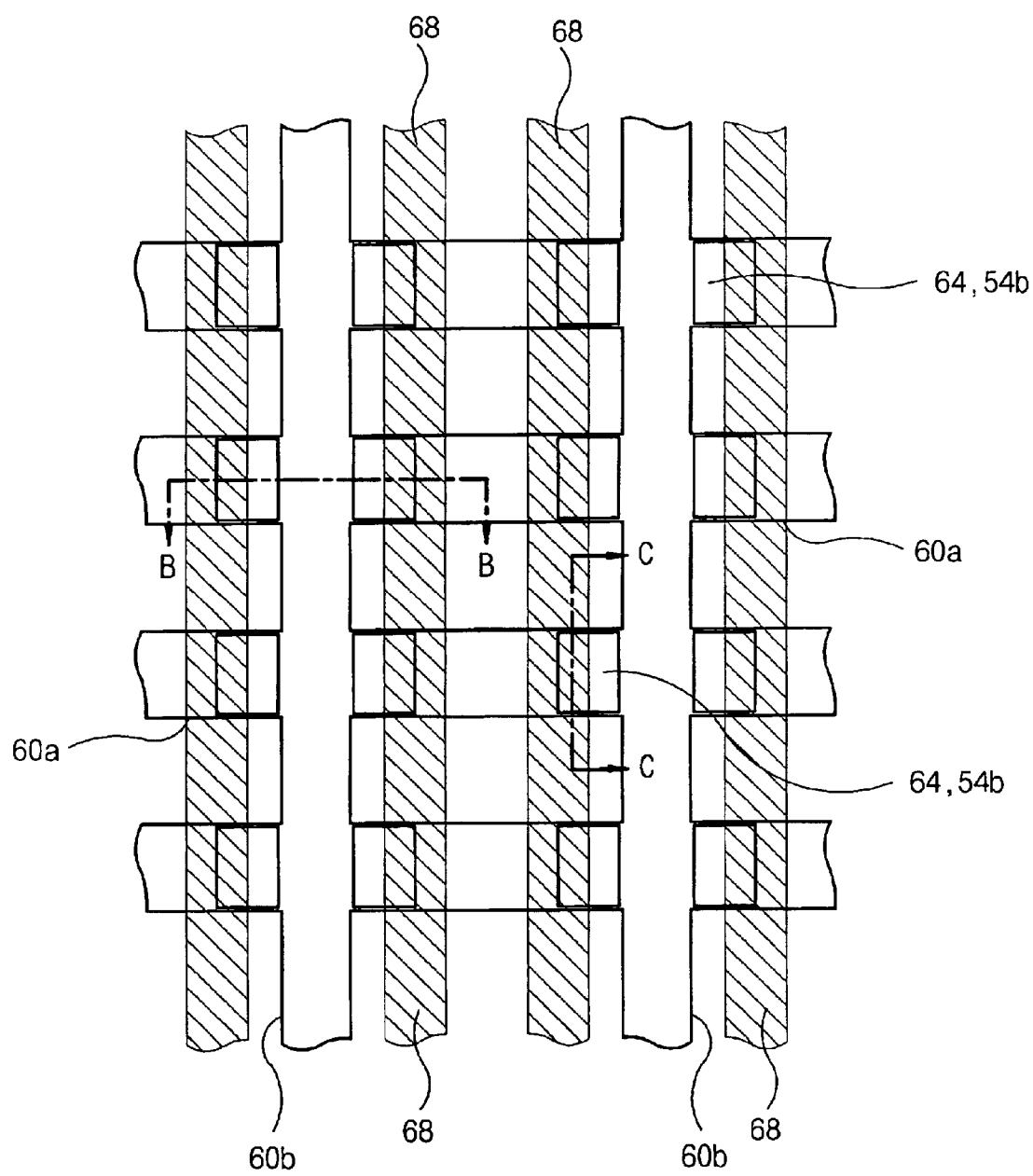
Figure 9B:
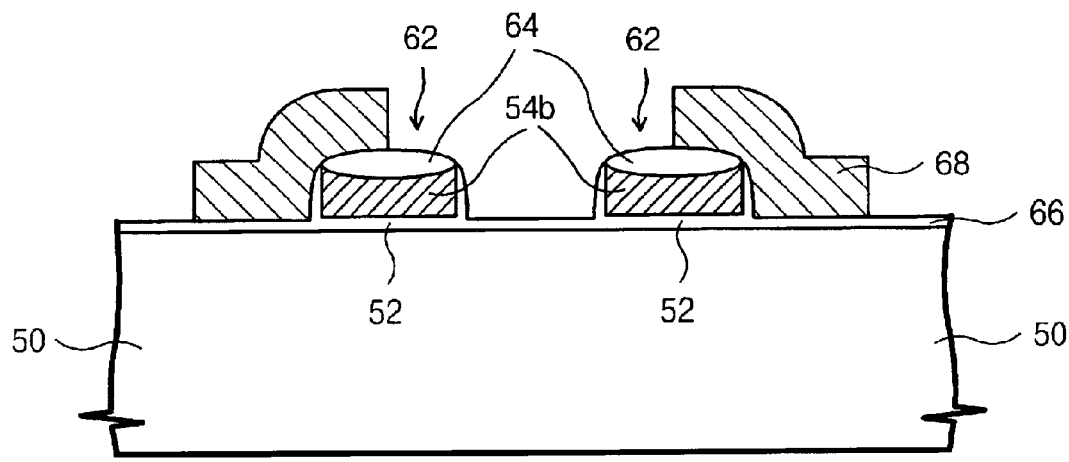
Figure 9C:
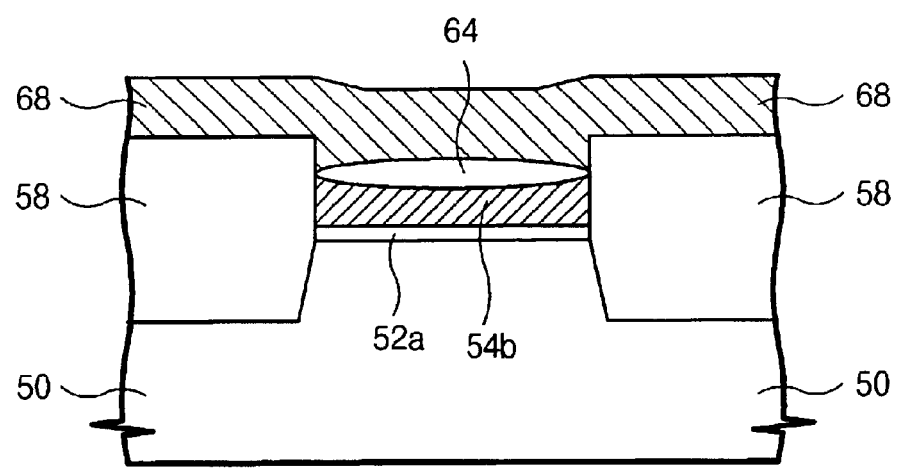

Referring to FIGS. 9A, 9B and 9C, a conductive layer is formed on an entire surface of a substrate with the floating gate patterns 54b and patterned to form a plurality of parallel word lines 68 crossing over the first active regions 60a. The word lines 68 lie on a portion of a top of the floating gate pattern 54b and on the first active region 60a adjacent to the floating gate pattern 54b. In addition, adjacent word lines 68 are disposed symmetrically. A pair of word lines 68 are disposed between the second active regions 60b forming a mesh shaped active region. A drain region is formed in the first active region 60a between the word lines 68 and a source region is formed in the second active region 60b between the word lines 68.

As a result, a split gate type FLASH memory device of the FIG. 2 can be formed.

According to an embodiment of the present invention, a floating gate pattern may not be influenced by a proximity effect or a misalignment occurring during a photolithographic process because a trench device isolation layer is formed first. Further, the floating gate pattern is formed to have sidewalls aligned to sidewalls of the trench device isolation layer. Therefore, a split gate type FLASH memory device can be formed to have substantially uniform cell characteristics in a cell array. In addition, floating gates of the memory cells connected to adjoining bit lines are isolated by the device isolation layer, so that a width of the device isolation layer can be reduced to improve integration of circuits.

What is claimed is:

1. A method of fabricating a FLASH memory device comprising:
    forming trench device isolation layers on a substrate for defining a plurality of parallel first active regions, and forming a stack on the first active regions comprising a gate insulation pattern, a conductive pattern, and a hard mask pattern, wherein the stack comprises sidewalls aligned to sidewalls of the trench device isolation layers;
    removing the hard mask pattern at regular intervals along each of the first active regions for exposing a top of the conductive pattern;
    forming an oxide pattern on the top of the conductive pattern;
    removing the hard mask pattern;
    etching the conductive pattern using the oxide pattern as an etch mask for forming floating gate patterns disposed on each of the first active regions at regular intervals;
    forming tunnel oxide layers on sidewalls of the floating gate patterns; and
    forming a plurality of parallel control gate electrodes disposed on the floating gate patterns, crossing over the first active regions.

2. The method of claim 1, wherein forming the trench device isolation layers comprises;
    stacking a gate insulation layer, a conductive layer and a hard mask layer on a substrate;
    patterning successively the hard mask layer, the conductive layer, the gate insulation layer and the substrate to form the stack including a plurality of parallel patterns comprising the gate insulation pattern, the conductive pattern and the hard mask pattern;
    etching the substrate to define a plurality of parallel active regions comprising the plurality of parallel first active regions and a plurality of second active regions using the hard mask pattern as an etch mask; and
    filling an insulation layer within regions between the plurality of parallel patterns for forming the trench device isolation layer.

3. The method of claim 1, wherein the top of the conductive pattern is lower than a top of the trench device isolation layer.

4. The method of claim 1, further comprising performing a thermal oxidation of the conductive pattern for forming an oxide pattern, wherein the conductive pattern is formed of polysilicon.

5. The method of claim 1, wherein the exposing the top of the conductive pattern comprises:
    forming a photoresist pattern on an entire surface of the substrate, wherein the photoresist pattern includes a plurality of parallel openings that intersect the first active regions and expose the hard mask pattern and the trench device isolation layer; and
    etching the hard mask pattern using the photoresist pattern as an etch mask.

6. The method of claim 1 further comprising forming a plurality of shared source regions disposed parallel to word lines and connected to the first active regions thereunder, wherein a pair of word lines are disposed between the plurality of shared source regions.

7. The method of claim 1, wherein defining the plurality of first active regions further comprises forming a plurality of parallel second active regions crossing over the first active regions for forming a mesh with the stack.

8. The method of claim 7, wherein the exposing the top of the conductive pattern comprises:
    forming a photoresist pattern including a plurality of openings parallel to the plurality of second active regions on an entire surface of the substrate, wherein a pair of openings are disposed between adjacent second active regions; and
    etching the hard mask pattern using the photoresist pattern as an etch mask for exposing two portions of the top of the conductive pattern over the first active region between intersections of the first and second active regions.

9. The method of claim 1, further comprising forming word lines on a portion of the floating gates and the first active regions.

10. A method of fabricating a FLASH memory device comprising:
    providing, sequentially, a substrate, a gate insulation layer, and a conductive layer, a hard mask layer;

forming trench device isolation layers in the substrate defining a plurality of parallel first active regions and a plurality of second active regions, the first and second active regions comprising a gate insulation pattern, and a conductive pattern, a hard mask pattern;

exposing portions of a top of the conductive pattern along each of the first active regions;

forming an oxide pattern on the top of the conductive pattern;

removing the hard mask pattern;

etching the conductive pattern using the oxide pattern as an etch mask for forming floating gate patterns disposed on each of the first active regions at regular intervals;

forming a plurality of word lines crossing over the plurality of first active regions, wherein the word lines are disposed on a portion of the floating gate pattern and on a portion each of the plurality of first action regions adjacent to the floating gate pattern.

11. The method of claim 10, wherein a pair of word lines is disposed between adjacent second active regions forming a mesh shaped active region.

12. The method of claim 11, further comprising:

forming a drain region in each of the plurality of first active regions between the word lines; and forming a source region in each of the plurality of second active regions between the word lines.

* * * * *